(12) United States Patent
Brown

(10) Patent No.: US 7,145,336 B2
(45) Date of Patent: Dec. 5, 2006

(54) OPPOSED ORTHOGONAL FUSION SYSTEM AND METHOD FOR GENERATING COLOR SEGMENTED MRI VOXEL MATRICES

(76) Inventor: Hugh Keith Brown, 83 Tsali Trail, Cleveland, GA (US) 30528

( * ) Notice: Subject to any disclaimer, the term of this patent is extended or adjusted under 35 U.S.C. 154(b) by 0 days.

(21) Appl. No.: 11/117,160

(22) Filed: Apr. 28, 2005

(65) Prior Publication Data

US 2005/0190955 A1    Sep. 1, 2005

Related U.S. Application Data

(62) Division of application No. 10/331,796, filed on Dec. 30, 2002, now Pat. No. 6,956,373.

(60) Provisional application No. 60/345,393, filed on Jan. 2, 2002.

(51) Int. Cl.
*G01V 3/00* (2006.01)

(52) U.S. Cl. .................................................... 324/309

(58) Field of Classification Search ...................... None
See application file for complete search history.

(56) References Cited

U.S. PATENT DOCUMENTS

| | | | |
|---|---|---|---|
| 4,789,831 A | 12/1988 | Mayo, Jr. | |
| 5,332,968 A | 7/1994 | Brown | |
| 5,375,156 A | 12/1994 | Kuo-Petravic et al. | |
| 5,410,250 A | 4/1995 | Brown | |
| 5,841,473 A | 11/1998 | Chul et al. | |
| 6,283,918 B1 | 9/2001 | Kanda et al. | |
| 6,377,831 B1 * | 4/2002 | Seshan et al. | ............... 600/407 |
| 6,414,261 B1 * | 7/2002 | Maetschke | ................... 219/109 |
| 6,414,487 B1 | 7/2002 | Anand et al. | |
| 6,668,097 B1 * | 12/2003 | Hu et al. | ..................... 382/275 |
| 2002/0032375 A1 | 3/2002 | Bauch et al. | |
| 2002/0045153 A1 | 4/2002 | Kaufman et al. | |
| 2002/0082492 A1 | 6/2002 | Grzeszczuk | |

* cited by examiner

*Primary Examiner*—Diego Gutierrez
*Assistant Examiner*—Dixomara Vargas
(74) *Attorney, Agent, or Firm*—Clements Walker; Richard A. Walker; Christopher L. Bernard

(57) ABSTRACT

The present invention provides a system and method for creating and manipulating one or more color-coded magnetic resonance images. The method includes acquiring a digitally-stored first gray tone series of images of a region of interest at a first predetermined time on a predetermined plane using a predetermined pulse sequence parameter, and applying a first color mask to the first gray tone series of images to create a first color masked series of images, wherein the first color masked series of images represent a first state of a biophysical property of interest. The method also includes acquiring a digitally-stored second gray tone series of images of the region of interest at a second predetermined time on the predetermined plane using the predetermined pulse sequence parameter, wherein the second predetermined time is subsequent to the first predetermined time, and applying a second color mask to the second gray tone series of images to create a second color masked series of images, wherein the second color masked series of images represent a second state of the biophysical property of interest. The method further includes spatially-aligning and combining the first color masked series of images and the second color masked series of images to create one or more full color images.

16 Claims, 1 Drawing Sheet

OPPOSED ORTHOGONAL FUSION SYSTEM AND METHOD FOR GENERATING COLOR SEGMENTED MRI VOXEL MATRICES

CROSS-REFERENCE TO RELATED APPLICATIONS

This application is a divisional application which claims the benefit of priority of U.S. patent application Ser. No. 10/331,796, filed on Dec. 30, 2002 now U.S. Pat. No. 6,956,373, entitled "Opposed Orthogonal Fusion System and Method for Generating Color Segmented MRI Voxel Matrices" which claims the benefit of priority of U.S. Provisional Patent Application No. 60/345,393, filed on Jan. 2, 2002, entitled "MRI Image Processing".

BACKGROUND OF THE INVENTION

I. Field of the Invention

The present invention relates generally to the field of magnetic resonance imaging (MRI) and, more particularly, to systems and methods for producing multidimensional tissue characterization images.

II. Description of the Related Art

MRIs are used for a variety of reasons such as medical diagnosis, surgical planning, and enhanced visualization of anatomic, physiologic and pathologic features. Radio frequency signals from three-dimensional tissue voxels are absorbed and then radiated when the tissue is placed in a strong magnetic field. These signals provide data for the spatial location and contrast discrimination of specific tissues, which are ultimately displayed as pixels comprising a two-dimensional MR image. These characteristics include longitudinal relaxation rate (T1), transverse relaxation rate (T2), proton density, magnetic susceptibility, and flow velocity and direction, and other biophysical properties. To emphasize contrast patterns of specific tissues, different image acquisition parameters or pulse sequences are utilized to produce various types of "weighted" images. The selection of different pulse sequences allows for the generation of spin echo images that are T1-weighted, T2-weighted, or proton density weighted, for example. Furthermore, echo planar, inversion recovery, fast spin echo, and gradient echo pulse sequences or "fast scans" can be utilized to obtain images that possess additional unique tissue-contrast patterns. In each type of image, individual tissues appear differently based on their own inherent biophysical characteristics. Contrast agents used in MRI, such as gadolinium also provide contrast for visualization of certain pathologies.

Various gray tone and color display methods have been developed for tissue characterization. Typically, gray tone methods have many limitations in the characterization since the human eye can only differentiate among 16 different gray tones. In a typical MRI, several of the echo images are taken and compared. For example, a MRI technician may use three scans (pulse sequences) for one region of interest, such as T1-weighted, T2-weighted, and inversion recovery scans. Subsequently, the doctor, or other person analyzing the scans, must look at each of the scans (which can be potentially hundreds of scans) of the particular region to determine the biophysical characteristic or pathology of concern. Accordingly, there can be subjective interpretations. In colorizing attempts, many of the present colorizations of MRI and CT scans simply apply colors without protocol and without capitalizing on the multi-parameter features of MRI.

There have been many attempts to create a single composite image from the plurality of scans as mentioned above. One such attempt is disclosed in U.S. Pat. Nos. 5,332,968 and 5,410,250, both to Brown. In these patents, single color-coded composite images are formed by acquiring a plurality of gray tone images and plotting a histogram of the average pixel intensities for selected regions of interest. Based on the histogram, color masks of red, green, and blue coefficients are assigned to the images of each pulse sequence such that a final combination of colors produces a series of semi-natural appearing composite images that provides automatic segmentation by color mapping that discloses specific physiological features and pathologies not easily identifiable in the plurality of gray tone images.

However, even with successful production of a series of single composite images, there is typically still a problem of obtaining a segmented or characterized three-dimensional rendering of the region of interest. As mentioned above, a three-dimensional tissue voxel is ultimately scanned into a two-dimensional MR image. In order to obtain a better three-dimensional understanding of the region of interest, MRI scans typically consist of acquiring several pulse sequences of a plurality of slices through the region of interest. Even having several scans of several slices, there lacks a method of automatic tissue segmentation that is required for an accurate and immediate three-dimensional rendering of regions of interest.

SUMMARY OF THE INVENTION

In general, the present invention features systems and methods for producing multidimensional tissue characterization images. In MRI, biophysical parameters of a region of interest are mapped as gray tone images. In the present method, color masks are applied to the specified gray tone images such that a color is assigned to each of the biophysical parameters represented. This is analogous to histological staining in which various chemical stains are applied to tissue slices to reveal the biophysical or biochemical features of the tissue. By combining colorized MRI composited from multiple gray tone MR images, riffle stacks can be formed and combined to render multidimensional reconstruction of anatomical, physiological, and pathological features. Biophysical parameters are therefore automatically segmented, characterized, tagged, mapped, and otherwise labeled. In another embodiment, gray tone images are collected by acquiring orthogonally opposed pulse sequences, the images of which are color masked and uniquely rendered in three dimensions to obtain voxels in which the color is determined by the summative color masks applied to original gray tone pixels. Specific applications can be designed for the brain, abdomen, pelvis, musculoskeletal, and other organs and biophysical systems to facilitate diagnosis, surgical planning, and virtual exploration.

The composite images may be considered as texture maps (here "texture" is the unique color of pixels resulting from the color composite process).

By assembly of the colorized MR images composited from multiple gray tone MR images, riffle stacks (also called cine stacks) can be formed from the series of color composites and combined to render multidimensional visualization of anatomical, physiological, and pathological features. Biophysical parameters are therefore automatically segmented, characterized, tagged, and otherwise labeled. Such segmentation is a prerequisite for three-dimensional rendering. Specific applications can be designed for the brain, abdomen, pelvis, musculoskeletal, and other organs and biophysical systems.

In general, in one aspect, the invention features a method of rendering multidimensional images, including automatic segmentation derived from colorized MR images is applied to segment, characterize, tag, and label different biophysical parameters of various tissue by unique color (such as red, green, blue (RGB); hue, saturation, intensity (HSI); and cyan, magenta, yellow (CMY)) to render multi-parameter images.

In another aspect, the invention features a method of characterizing biophysical parameters, including collecting gray tone image sets for orthogonal slices, combining the data sets to a single data set for a single orthogonal plane, and combining a plurality of slices to render a three-dimensional image.

In one implementation, collecting gray tone image sets for orthogonal slices includes obtaining spatially aligned gray tone magnetic resonance images at predetermined pulse sequences to provide data of the spatial location and contrast discrimination of tissue voxels in the form of pixels having varies intensities.

In another implementation, combining the data sets to form a single data set for a single orthogonal slice includes identifying selected regions of interest in each image representing similar tissues, plotting average signal intensities of pixels within each region of interest for each image, assigning a different monochrome color to each of the images based on the profile or pattern of signal intensities and on a desired final color rendition of a composite image formed of the gray tone images, combining the gray tone images with the monochrome color assigned to each image into a single composite image having pixels of varying hue, saturation, and intensity based on the intensities of the original gray tone images, and, on their assigned monochrome colors, forming the composite image having semi-natural anatomic appearance.

In another implementation, the method further includes enhancing segmentation by adjusting the alpha value of pixels (opacity) that have similar RGB values.

In another implementation, the biophysical parameter is tissue volume.

In another aspect, the invention features a method of processing images from dynamic contrast studies data, including collecting gray tone image sets at time intervals and combining the gray tone image set from each time interval to form a single color data image.

In another aspect, the invention features a method of calculating tissue volume, including obtaining a three-dimensional rendering a region of interest from riffle stacks and calculating the volume from the calibrated number of voxels representing the specified tissue or fluid in the three-dimensional rendering.

In one implementation, the tissue is selected from the group consisting of a tumor, CSF volume, gray v. white matter, edema, penumbra, and likewise other anatomical features.

In still another aspect, the invention features a method comprising applying color image processing of MR images by an automatic segmentation method to be rendered as multidimensional data sets for interactive viewing, wherein the process includes creating a series of segmented images from MRI data to be used for multidimensional rendering.

In yet another aspect, the invention features a method for rendering a multidimensional MR image, comprising producing a single color-coded composite image from a plurality of multi-parameter MR image sets, wherein the image sets are spatially aligned and are acquired using different pulse sequences to contrast various parameters of anatomical, physiological, and pathological features.

In one implementation, the method further includes acquiring gray tone images and plotting a histogram of the averaged pixel signal intensities for selected regions of interest in each image to obtain a profile or pattern of tissue characterizing contrast behavior.

In another implementation, the method further includes extracting data to support qualitative assessments of tissue contrast behavior in each of the image sets that acts as a basis for color coding.

In another aspect, the invention features a method for rendering a multidimensional MR image, including obtaining a plurality of gray tone magnetic resonance images at a plurality of predetermined orthogonally oriented pulse sequences to provide data of the spatial location and contrast discrimination of voxels formed by the intersection of the orthogonally oriented pulse sequences and assigning a different monochrome color to each of the orthogonal sets of images based on the signal intensities and on a desired final color rendition of a composite image formed of the plurality of images.

In one implementation, the orthogonally oriented pulse sequences are oriented in the sagittal, coronal, and axial planes of a patient.

In another aspect, the invention features method for rendering a multidimensional MR image, obtaining three two-dimensional orthogonal plane series of images, creating a color masked texture map rendition of each of the two-dimensional images and additively superimposing the three texture mapped renditions to a three-dimensional image.

In one implementation, obtaining the three two-dimensional orthogonal plane series of images includes applying a first pulse sequence in a first plane, applying a second pulse sequence in a second plane, applying a third pulse sequence in a third plane, applying a color mask to each of the images obtained from applying the pulse sequences in the planes, and identifying the spatial location and unique color coefficient obtained at the intersection of the pixels of the three planes and recording such location as a unique color voxel.

In another implementation, recording the location includes creating a color voxel at the location using the color coefficients.

In another implementation, the totality of voxels created is a three-dimensional data set.

In another aspect, the invention features a computer program residing on a computer-readable medium comprising instructions for causing a computer to produce a single color-coded composite image from a plurality of multi-parameter MR image sets, wherein the image sets are spatially aligned and are acquired using different pulse sequences to contrast various parameters of anatomical, physiological, and pathological features, acquire gray tone images, and plot a histogram of the averaged pixel signal intensities for selected regions of interest in each image.

In another aspect, the invention features a computer program residing on a computer-readable medium comprising instructions for causing a computer to automatically segment images derived from colorized MR images that is applied to segment, characterize, tag, and label different biophysical parameters of various tissue by unique color to render a multidimensional image.

In another aspect, the invention features a computer program residing on a computer-readable medium comprising instructions for causing a computer to collect gray tone image sets for orthogonal slices, combine the data sets to a single data set for each single tissue slice, and combine a plurality of slices to render a three-dimensional image.

In another aspect, the invention features an MR image processing apparatus, including a computer having a process to apply selected color masks, to combine the masked MRI gray tone images to a series of composited color images, and a process residing on the computer to combine a plurality of composited color images to a three-dimensional image.

In another aspect, the invention features an MR image processing display, including a screen for viewing single riffle stack images, the riffle stacks being formed by single color composite images formed by a plurality of gray tone images, and a screen for viewing three-dimensional combined riffle stacks.

In one implementation, the display includes an alpha adjustment control and means for selecting pixels possessing specified color coefficients and applying alpha (opacity) adjustment to them.

In another implementation, the display includes controls to interactively control the pitch, roll, and yaw of the three-dimensional combined riffle stacks.

In another aspect, the invention features a method, including pseudo-ray casting for fast three-dimensional rendering by fusion of opposed orthogonal two-dimensional texture map renderings created from the segmented color riffle stacks.

In another aspect, the invention features a method of pseudo-ray casting for fast three-dimensional rendering by fusion of opposed orthogonal two-dimensional texture map renderings created from the segmented color riffle stacks. The fused rendering provides ray cast quality but can be accomplished on a computer in a relatively short time.

In another aspect, the invention features a method of pseudo-ray casting for fast three-dimensional rendering through fusion of three-dimensional monochrome (one color) renderings of multi-pulse sequences within three orthogonal planes (sagittal, axial, and coronal) to create full color three-dimensional rendering that is viewable from three orthogonal planes simultaneously (assuming image registration). In order to accomplish this, the orientation of the images in each of the orthogonal planes including right/left discrimination and direction of increment is generally known. Texture mapped gray tone three-dimensional renderings are generated from each pulse sequence within each orthogonal plane (e.g., sagittal=T1, axial=T2, and coronal=SPGR). To begin, the three-dimensional gray tone renderings for each orthogonal plane are assigned a specific color masking protocol. These three-dimensional monochrome renderings are then locked into position. The sagittal three-dimensional monochrome rendering is rotated 90 degrees counterclockwise on the vertical axis and 90 degrees in the horizontal axis. This position is then locked in as the starting point of the interactive movement (pitch, yaw, and roll). The coronal three-dimensional monochrome rendering is rotated 90 degrees to the left on the vertical axis. This position is locked as the starting point of interactive movement (pitch, yaw, and roll). These three-dimensional monochrome rendering in locked position (aligning at a central point) are then fused to produce a full color three-dimensional rendering that is viewable from the three orthogonal planes. Opacity adjustment per coefficient factors accomplishes surface rendering. This method of three-dimensional rendering provides ray case quality but is accomplishable on a PC in real time. This virtual volume rendering creates the visualization of voxels because of the multi-planar representations filling the gaps between successive slices of the texture mapped renderings.

One advantage is that multiple gray tone images are combined into a color composite three-dimensional rendition in which regions of interest are easily made to appear as surface renderings by selective alpha (opacity) adjustment.

Another advantage of the invention is that a user studying MR images can view a single color image that automatically characterized biophysical parameters for each tissue of interest, in contrast to multiple gray tone images representing each tissue.

Another advantage of the invention is that the several single color images can be combined for multidimensional viewing.

Another advantage is that the colorized three-dimensional images obtained by the methods can disclose a combination of biophysical parameters typically undisclosed by a series of single parameter gray tone images.

Another advantage is that since the method of summative color composite tissue mapping is analogous to histologic staining, it is easily understood by medical personnel.

Other objects, advantages, and capabilities of the invention will become apparent from the following description taken in conjunction with the accompanying drawings showing the preferred embodiment of the invention.

DETAILED DESCRIPTION

Figure 1:
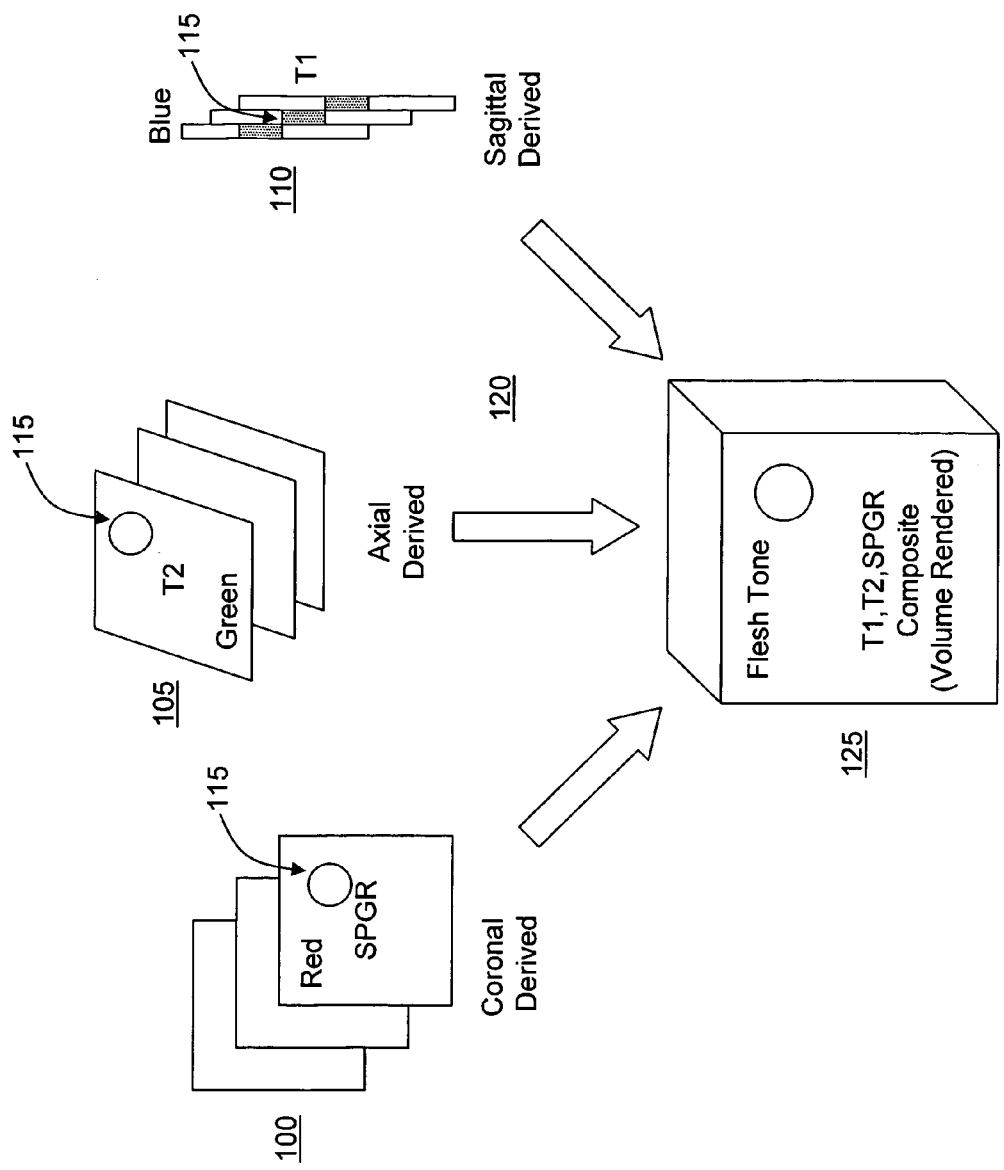
FIG. 1 illustrates a flow chart of an implementation of an orthogonal fusion of MRI three-dimensional renderings.

References to U.S. Pat. Nos. 5,332,968 and 5,410,250 are made throughout this description and are herein incorporated by reference.

As achieved in earlier patents U.S. Pat. Nos. 5,332,968 and 5,410,250, automatic segmentation by assigning color to biophysical parameters of MR images is made possible.

In general, this automatic segmentation is applied to segment, characterize, "tag", or otherwise "label" different biophysical parameters of various tissue by unique color (RGB, HSI, CMY) is the prerequisite for three-dimensional rendering without the various problems that exist today in characterizing images. In general, apparatuses and methods are described for producing a single color-coded composite image from a plurality of multi-parameter MR image sets. Typically, these image sets are spatially aligned and are acquired using different pulse sequences to contrast various parameters of anatomical, physiological, and pathological features. The methods include acquiring gray tone images and plotting a histogram of the averaged pixel signal intensities for selected regions of interest in each image. These methods provide data to support qualitative assessments of tissue contrast behavior in each of the images that acts as a basis for color-coding.

For an MRI study, a plurality of pulse sequences produce several sets of gray tone images that map biophysical parameters of the slice positions through the anatomical structures of interest. Color composites are generated from these sets to produce a series of full color images, one for each slice position. For example, one slice can include four different pulse sequences (such as T1, T2, PD, and FLAIR) to create one image. This series of color images is assembled for viewing as a riffle stack. In an embodiment, color MRI riffle stacks can be used as the image source for tissue characterization (typically defined by the biophysical parameters of various tissues being characterized by their nuclear magnetic resonance properties such as T1, T2, PD, magnetization state, and speed and direction of motion), classification (based on their characteristics, tissues can be classified into categories such as serious fluid, mutinous fluid, hemorrhage of various ages and stages, as well as gray matter, white matter, and other tissues of the body), and segmentation (once a region is classified, it may be highlighted or somehow visually isolated so that its shape and boundaries and identity is distinguished) according to the unique color (RGB, HSI, CMY) generated by the colorization MRI methods. Riffle stacks may then be used as a basis for multidimensional visualization. Typically, the riffle stacks (cine stacks) are used for "three-dimensional" visualization through two-dimensional texture mapping or via ray casting for true three-dimensional renderings. Interactive visualization of three-dimensional rendition means that the user can tilt, yaw, or rotate the three-dimensional rendering at will using a mouse, joy stick, or similar device. These rendering retain the specific automatically segmented tissue colors. For true three-dimensional representations or reconstructions of specific tissue types by their specific color (for example, RGB), the alpha values for each of these color channels are typically separately adjustable. This flexibility allows selection by opacity/transparency level for any color resulting from the combination of RGB values for a range of pixel colors, thus further enhancing the visualization of a specified tissue or fluid in contrast to other tissues or fluids.

Because this method imparts a unique color based on the properties (NMR biophysical parameters) to the pixels representing tissues or fluids identifiable in MR images, it can be the used to generate image sets which can be rendered directly as three-dimensional visualizations by a number of algorithms including, but not limited to, texture mapping and ray casting. The transparencies of specified tissues or the overall rendition may be adjusted by the user.

The images can typically be displayed on a monitor. In one embodiment, region of interest (sample of pixels or voxels) is selected in its most representative tissue area. The RGB values for these pixels are averaged or bracketed for inclusiveness. This RGB value or values is recorded to a data file. A window for adjustment of alpha value is opened. This window allows adjustment of the alpha value for each of the three color components (red, green, blue). These values are set to decrease the transparency of the voxels in the color range of the selected sample by referring to the recorded data file, mentioned above. When the unique combination of these three alpha values is applied to the three-dimensional composite image data set, all tissues corresponding to that unique color are effectively extracted as a structural feature. That structural feature can then be displayed as a three-dimensional object. Similarly, any number of unique tissue types identified by their unique RGB components can be extracted and displayed as three-dimensional objects either singularly or in combination. In general, the images can be manipulated with any suitable computer control such as a mouse, keyboard, joystick, and the like.

As mentioned in the above discussion, there are a large number of MRI pulse sequences that can be used to obtain the MRI data, including, but not limited to, T1 (longitudinal relaxation), T2 (transverse relaxation), PD (proton density), and GR (gradient recovery). Typically, the pulse sequences can be used for routines, including, but not limited to, routine brain sequences (e.g., headache, non-acute stroke, non-specific signs and symptoms): Sag T1, axial FLAIR, axial FSE T2, axial DWI; routine Brain with Gado: neoplasms, inflammatory and infectious processes: axial T1, axial FLAIR, axial FSE T2, axial DWI, post-gadolinium sagittal, axial and coronal T1; acute Stroke (new onset acute neurologic deficit with no hemorrhage on CT), Sag T1, axial FLAIR, axial two-dimensional, directional phase contrast Circle of Willis, axial DWI, post Gado axial spin echo; primary tumor/metastases (routine brain with gado), axial T1, axial FLAIR, axial, FSE T2, axial DWI, post-gadolinium sagittal, axial and coronal T1; acute Stroke (new onset acute neurologic deficit with no hemorrhage on CT), Sag T1, axial FLAIR, axial two-dimensional, directional phase contrast Circle of Willis, axial DWI, post Gado axial spin echo; primary tumor/metastases (routine brain with Gado), axial T1, axial FLAIR, axial T2, axial DWI, MRS (MR spectroscopy), post Gado sagittal, axial and coronal T1, add axial MPGR susceptibility sequences for melanoma and hemorrhagic metastases; pediatric brain (congenital abnormality/developmental delay/abnormal myelination/migration abnormality abnormality—routine pediatric brain, age 0–2), Sag T1, axial T1, dual echo axial SE T2, for age 2 or older, axial T1, axial FLAIR, axial FSE T2, coronal 1.5 mm SPGR, axial DWI; musculoskeletal routines, such as routine knee, coronal T1, coronal ST1R, axial T2 FSE, sagittal PD & T2 SE.

Interactive viewing of color segmented, three-dimensional visualizations may have significant applications in medical education, diagnosis, surgical planning, and image guided surgical procedures. Software to enable a user to "click" on a segmented tissue (or combination of tissues) can be used for interactive visualization of the three-dimensional extent of that tissue exclusive of all other tissues.

The three-dimensional renderings of color MRI data sets can provide the basis for volume measurements of user specified, color segmented tissues or fluids (normal or pathologic) when the number of voxels (calibrated to cubic mm) represented by its unique color is calculated. Similarly, applications may be used for brain, musculoskeletal, abdominal, and pelvic organs.

Brain

Applications in brain imaging could include monitoring tumor volume, multiple sclerosis lesion load, CSF volumes, gray versus white matter, edema, penumbra, and the like. The pulse sequences required for these studies include, but are not limited to, T1, T2, SPGR, FLAIR, ST1R, Diffusion weighted, and post-gadolinium T1 weighted. The T1 monochrome mask is in the orange range, the T2 monochrome mask is in the blue-green range, the FLAIR monochrome mask is in the violet-magenta range, the SPGR monochrome mask is in the red range, the ST1R monochrome mask is in the yellow-orange range, the Diffusion weighted monochrome mask is in the brilliant green range, and the post-gadolinium T1 weighted subtraction image mask is in the magenta range (the pre-Gado T1 image when subtracted from the Post-Gado image created the specific subtraction image, texture mapping only the Gadolinium enhancement).

Specifically detecting and differentiating the stages of intracranial hemorrhagic lesions (from stroke or trauma) can be problematic. The improved visualization and color differentiation of the characteristics for acute, sub-acute, sub-chronic, and chronic may be achieved more efficiently with this methodology of automatic tissue segmentation. The pulse sequences involved here include T1, T2, proton density T2* weighted gradient echo (for enhanced magnetization susceptibility), and SPGR (for flowing blood).

Abdomen

Applications such as the analysis of liver masses, fatty infiltration, and the like, could be rendered. Differentiation of liver masses and detection of fatty infiltration can be accomplished using a protocol in which a T1, T2, SPGR, ST1R, and FLAIR are included. These pulse sequences can provide better detection and visualization of the subtle gray tone differences in liver parenchyma (HCC, colon cancer metastases, etc.) The color assignment for T1 in the yellow range, T2 in the green-blue range, SPGR in the red range, and FLAIR in the magenta red range produces a seminatural color visualization of the abdominal organs. Contrast agents (GD, Mn, Fe, etc.) expand the capability to map the pathological foci. The opportunity for virtual abdominal exploration via such three-dimensional rendering is achieved.

Other applications include the analysis of pancreatic and renal tumors.

Pelvis

Non-invasive ability to differentiate and characterize ovarian and uterine masses is of crucial importance in the diagnosis of gynecological pathology. Specific differentiation of ovarian cystic contents including various ages of hemorrhage, mutinous, serious, and dermoid can be demonstrated. These can be accomplished using T1, T2, and T1 weighted gradient echo sequences with colors assigned to T1 being in the yellow-orange range, T2 in the blue-green range, and a T1 weighted gradient echo in the red range. Urinary bladder and physiologic cyst in the ovary are dramatically and non-invasively visualized in the three-dimensional interactive mode described herein.

Non-invasive, tissue segmented fetal and ectopic pregnancy visualization, characterization, and three-dimensional examination in-utero can also be performed.

Musculo skeletal

Soft tissue masses and injuries can be more accurately differentiated and diagnosed. The specific application for early detection of avascular necrosis of the femoral head indicated gray tone changes that produced ring sign can be visualized at an earlier stage of the disease than presently possible with traditional gray tones. Differentiation of hemorrhagic versus edematous lesions of the bone marrow can also be better visualized and detected using color protocols very similar to abdominal protocols. In general, growth plate inquiries and their associated pathologies are better detected and visualized by tissue segmentation. The disruption of growth plate integrity can be better visualized in multidimensional, interactive renditions.

Breast Dynamic Contrast Studies

Dynamic contrast studies for the detection of breast cancer can be visualized as a series of multicolored stages in one multicolored image per slice and the stereotactic location of clusters or lesions can be visualized using this methodology of color segmentation. As described above, the use of multiple gray image sets is improved by combining the sets to a single color image that can then be a single riffle stack in a multidimensional image. In another implementation, gray tone data sets used for dynamic contrast studies can also be improved. In conventional dynamic contrast studies, the subject is administered a contrast agent by intravenous injection. MR images are then typically taken at time intervals such as one, three, five, and eight minutes. The appearance of changing gray tones in specific areas can indicate certain biophysical parameters, such as a malignancy. In some situations, up to 32 images per interval have to be taken. With the methods described above, the gray tones can be combined to render a single three-dimensional color image encompassing all of the image sets taken at all the time intervals in this case, a visualization of the four dimensional information is visually discerned, thus dramatically improving and speeding accurate interpretation.

In a specific embodiment, the process for rendering the images can be implemented in a colorizing MRI software which assembles MR image data to produce color segmented composite images and presents the resulting images as interactive riffle stacks and three-dimensional visualizations. Typically, a screen can be displayed containing gray riffle stacks that are used to produce the color composite images. The riffle stacks are typically labeled by pulse sequence. A user can view the properties of the images, save to a JPEG format for iJAVA 2000, view DICOM tags, or rescale gray levels. The user can proceed to data set selection and RCP formulation. Typically, the software highlights sets of pulse sequences used to make color composite images. The user can choose a different set if desired. When the composite is complete, the screen displays the color composite riffle stack. The user can then view the three-dimensional rendering. The user can rotate the image to view different aspects of the composite image. If desired, the user can adjust the transparency to subtract out certain tissues or fluids (and the like) by specified alpha opacity adjustments.

In other embodiments, the user can save the color composite and three-dimensional renderings in a separate data file from the gray tone images. The user can also have multiple permutations of Riffle Stack Colorization Protocols (RCPs) for varied pulse sequence sets. In another embodiment, there is an option for pre-choreographed or free-style recording of AVI movies of three-dimensional image rotation.

The embodiments described above have taken single color coded composite images from previously obtained multi-parameter MR image sets (gray tone) and created riffle stacks to yield a three-dimensional rendering of a region of interest. The gray tone MR images (typically saved in DICOM files) are routinely acquired in three planes of the patient, the planes being sagittal, coronal, and axial. For example, in acquiring MR images, a first sagittal set is acquired using a T1 pulse sequence. Subsequent T2, PD, and other sagittal pulse sequences are acquired. As described above, each of the T1, T2, and PD pulse sequences in each slice are made into a single color image for each slice. Tissues are automatically segmented by their unique colors. Those color images then constitute a riffle stack that is ready for three-dimensional rendering. Each single color-coded image includes two-dimensional colorized pixels as a texture map. By applying a three-dimensional rendering algorithm, the riffle stacks yield a three-dimensional rendition. In another embodiment, instead of taking already existing gray tone images from each single slice in one plane, the same pulse sequences can be applied in different planes of the patient. Therefore, for example, T1 can be applied to the sagittal plane, T2 can be applied to the coronal plane, and PD or FLAIR can be applied to the axiam plane. It is understood that any pulse sequence can be applied to any of the planes. The resulting intersection point of the three planes, and thus the intersection of the pulse sequences, defines a voxel. The color codes can then be applied to the three-dimensional multi-parameter gray tone images, that is, the color-coding algorithms can be applied to each of the pulse sequence images in each separate plane. In this way, a true dimensional colorized voxel is obtained takes the already available gray tone scans from each slice. In this way, each composite image includes two-dimensional colorized pixels. Applying the riffle stacks yields a three-dimensional rendition. In another embodiment, instead of taking already existing gray tone images from each single slice in one plane, the same pulse sequences can be applied in different planes of the patient. Therefore, for example, T1 can be applied to the sagittal plane, T2 can be applied to the coronal plane and PD can be applied to the axial plane. It is understood that any pulse sequence can be applied to any of the planes. The resulting intersection point of the three planes, and thus the intersection of the pulse sequences, defines a voxel. The color codes can then be applied to the three-dimensional multi-parameter gray tone images, that is, the color coding algorithms can be applied to each of the pulse sequence images in each separate plane. In this way, a true three-dimensional colorized voxel is obtained.

In a specific implementation, a texture mapped three-dimensional sagittal monochrome rendering, a texture mapped three-dimensional axial monochrome rendering, and a texture mapped three-dimensional coronal monochrome rendering can be obtained. Once obtained each of the images can undergo an orientation alignment. Each of the renderings are then fused to obtain a color true three-dimensional rendering of fused sagittal, axial, and coronal orthogonal planes.

In another embodiment, pseudo-ray casting for fast three-dimensional rendering through fusion of three-dimensional monochrome (one color) renderings of multi-pulse sequences within three orthogonal planes (sagittal, axial, and coronal) to create full color three-dimensional rendering in which three orthogonal planes are viewed simultaneously (assuming proper image registration). In order to accomplish this pseudo-ray casting, the orientation of the images in each of the orthogonal planes including right/left discrimination and direction of increment is generally known. Texture mapped gray tone three-dimensional renderings are generated from each pulse sequence within each orthogonal plane (e.g., sagittal=T1, axial=T2, and coronal=SPGR). To begin, the three-dimensional gray tone renderings for each orthogonal plane are assigned a specific color mask by appropriate protocol. These three-dimensional monochrome renderings are then locked into position. The sagittal three-dimensional monochrome rendering is rotated 90 degrees counterclockwise on the vertical axis and 90 degrees in the horizontal axis. This position is then locked in as the starting point of the interactive movement (pitch, yaw, and roll). The coronal three-dimensional monochrome rendering is rotated 90 degrees to the left on the vertical axis. This position is locked in as the starting point of interactive movement (pitch, yaw, and roll). These three-dimensional monochrome renderings in locked position (aligning at a central point) are then fused to produce a full color three-dimensional rendering that is viewable from the three orthogonal planes and interactively pitched, yawed, or rolled for other angles of view. Transparency and coefficient factors are considered. This method of three-dimensional rendering provides ray cast quality but is accomplishable on a PC in real time. This virtual volume rendering creates the visualization of voxels because of the multi-planar representations filling the gaps between successive slices of the texture mapped renderings.

In the embodiments described above, the pulse sequences are typically applied in orthogonal planes. It is understood that the planes may be arranged at other angular orientations other than orthogonal. In addition, three orthogonal planes are typically used. It is also understood that other numbers of planes can be used such as two or more planes, and can be oriented at other angles other than orthogonal.

FIG. 1 illustrates a flowchart of an implementation of an orthogonal fusion of MRI three-dimensional renderings. This flowchart illustrates a visualization of how a region of interest 120 in three dimensions can be rendered into a volume composite 125 from three planar pulse sequences 100, 105, 110 including the region of interest 115 in three two-dimensional renderings. Riffle stacks or texture mapped rendering of the images from several pulse sequences (in opposed orthogonal planes) are each assigned color masks. The orthogonal planes (and color masks) are typically coronal, axial, and sagittal derived. Images fusion or merging by computer readable instructions is obtained such that resulting voxels can be interactively visualized in their entirety from any perspective. Voxel selection per color coefficients and subsequent adjustment of opacity of like voxels to accomplish their removal by low opacity or enhanced visualization or "surface rendering" by high opacity can subsequently be accomplished.

The software techniques and methods discussed above can be implemented in digital electronic circuitry, or in computer hardware, firmware, software, or in combinations of them. Apparatus may be implemented in a computer program product tangibly embodied in a machine-readable storage device for execution by a programmable processor; and methods may be performed by a programmable processor executing a program of instructions to perform functions by operating on input data and generating output. Further embodiments may advantageously be implemented in one or more computer programs that are executable on a programmable system including at least one programmable processor coupled to receive data and instructions from, and transmit data and instructions, to a data storage system, at least one input device, and at least one output device. Each computer program may be implemented in a high level procedural or object-oriented programming language, or in assembly or machine language, which can be compiled or interpreted. Suitable processors include, by way of example, both general and special purpose microprocessors. Generally, a processor receives instructions and data from read-only memory and or RAM. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially designed application specific integrated circuits (ASICs).

Therefore, the foregoing is considered as illustrative only of the principles of the invention. Further, various modifications may be made of the invention without departing from the scope thereof and it is desired, therefore, that only such limitations shall be placed thereon as are imposed by the prior art and which are set forth in the appended claims.

What is claimed is:

1. A method for creating one or more color-coded magnetic resonance images, comprising:

acquiring a digitally-stored first gray tone series of images of a region of interest at a first predetermined time on a plurality of predetermined orthogonally-opposed planes using a plurality of predetermined pulse sequence parameters;

applying a first color mask to the first gray tone series of images to create a first color masked series of images, wherein the first color masked series of images comprise a plurality of pixels that each represent a first state of a biophysical property of interest;

acquiring a digitally-stored second gray tone series of images of the region of interest at a second predetermined time on the plurality of predetermined orthogonally-opposed planes using the plurality of predetermined pulse sequence parameters, wherein the second predetermined time is subsequent to the first predetermined time;

applying a second color mask to the second gray tone series of images to create a second color masked series of images, wherein the second color masked series of images comprise a plurality of pixels that each represent a second state of the biophysical property of interest; and spatially-aligning and combining the first color masked series of images and the second color masked series of images to create one or more full color images comprising a plurality of voxels.

2. The method of claim 1, wherein a contrast material has been introduced into the region of interest prior to obtaining one or more of the first gray tone series of images of the region of interest at the first predetermined time and the second gray tone series of images of the region of interest at the second predetermined time.

3. The method of claim 2, wherein the one or more full color images illustrate the wash-in/wash-out of the contrast material into/out of the region of interest.

4. The method of claim 1, wherein each of the plurality of predetermined orthogonally-opposed planes comprises one of sagittal, axial, and coronal.

5. The method of claim 1, wherein each of the plurality of predetermined pulse sequence parameters comprises one of longitudinal relaxation rate (T1), transverse relaxation rate (T2), proton density (PD), gradient recovery (GR), inversion recovery (IR), magnetic susceptibility, and flow velocity and direction.

6. The method of claim 1, wherein the first color mask and the second color mask each comprise one of a red-green-blue (RGB) color mask, a hue-saturation-intensity (HSI) color mask, and a cyan-magenta-yellow (CMY).

7. The method of claim 1, wherein the region of interest comprises at least a portion of one of a human breast and a human liver.

8. A system for creating one or more color-coded magnetic resonance images, comprising:

acquisition means for acquiring a digitally-stored first gray tone series of images of a region of interest at a first predetermined time on a plurality of predetermined orthogonally-opposed planes using a plurality pf predetermined pulse sequence parameters;

processing means for applying a first color mask to the first gray tone series of images to create a first color masked series of images, wherein the first color masked series of images comprise a plurality of pixels that each represent a first state of a biophysical property of interest;

acquisition means for acquiring a digitally-stored second gray tone series of images of the region of interest at a second predetermined time on the plurality of predetermined orthogonally-opposed planes using the plurality of predetermined pulse sequence parameters, wherein the second predetermined time is subsequent to the first predetermined time;

processing means for applying a second color mask to the second gray tone series of images to create a second color masked series of images, wherein the second color masked series of images comprise a plurality of pixels that each represent a second state of the biophysical property of interest; and processing means for spatially-aligning and combining the first color masked series of images and the second color masked series of images to create one or more full color images comprising a plurality of voxels.

9. The system of claim 8, wherein a contrast material has been introduced into the region of interest prior to obtaining one or more of the first gray tone series of images of the region of interest at the first predetermined time and the second gray tone series of images of the region of interest at the second predetermined time.

10. The system of claim 9, wherein the one or more full color images illustrate the wash-in/wash-out of the contrast material into/out of the region of interest.

11. The system of claim 8, wherein each of the plurality of predetermined orthogonally-opposed planes comprises one of sagittal, axial, and coronal.

12. The system of claim 8, wherein each of the plurality of predetermined pulse sequence parameters comprises one of longitudinal relaxation rate (T1), transverse relaxation rate (T2), proton density (PD), gradient recovery (GR), inversion recovery (IR), magnetic susceptibility, and flow velocity and direction.

13. The system of claim 8, wherein the first color mask and the second color mask each comprise one of a red-green-blue (RGB) color mask, a hue-saturation-intensity (HSI) color mask, and a cyan-magenta-yellow (CMY).

14. The system of claim 8, wherein the region of interest comprises at least a portion of one of a human breast and a human liver.

15. A method for creating one or more color-coded magnetic resonance images, comprising:

acquiring a digitally-stored first gray tone series of images of a region of interest at a first predetermined time on a plurality of predetermined planes using a plurality of predetermined pulse sequence parameters;

applying one or more first color masks to the first gray tone series of images to create a first color masked series of images, wherein the first color masked series of images comprise a plurality of pixels that each represent a first state of one or more biophysical properties of interest;

acquiring a digitally-stored second gray tone series of images of the region of interest at a second predetermined time on the plurality of predetermined planes using the plurality of predetermined pulse sequence parameters, wherein the second predetermined time is subsequent to the first predetermined time;

applying one or more second color masks to the second gray tone series of images to create a second color masked series of images, wherein the second color masked series of images comprise a plurality of pixels that each represent a second state of the one or more biophysical properties of interest; and spatially-aligning and combining the first color masked series of images and the second color masked series of images to create one or more full color images, wherein the one or more full color images each comprise a three-dimensional matrix of voxels.

16. A system for creating one or more color-coded magnetic resonance images, comprising:

acquisition means for acquiring a digitally-stored first gray tone series of images of a region of interest at a first predetermined time on a plurality of predetermined planes using a plurality of predetermined pulse sequence parameters;

processing means for applying one or more first color masks to the first gray tone series of images to create a first color masked series of images, wherein the first color masked series of images comprise a plurality of pixels that each represent a first state of one or more biophysical properties of interest;

acquisition means for acquiring a digitally-stored second gray tone series of images of the region of interest at a second predetennined time on the plurality of predetermined planes using the plurality of predetermined pulse sequence parameters, wherein the second predetermined time is subsequent to the first predetermined time;

processing means for applying one or more second color masks to the second gray tone series of images to create a second color masked series of images, wherein the second color masked series of images comprise a plurality of pixels that each represent a second state of the one or more biophysical properties of interest; and processing means for spatially-aligning and combining the first color masked series of images and the second color masked series of images to create one or more full color images, wherein the one or more full color images each comprise a three-dimensional matrix of voxels.

* * * * *